US009029992B2

(12) United States Patent
Kim et al.

(10) Patent No.: US 9,029,992 B2
(45) Date of Patent: May 12, 2015

(54) ELECTRONIC PACKAGE STRUCTURE WITH INSULATED ADHESION PORTION FOR AFFIXING AND ISOLATING LANDS SPACED APART FROM LAND CONNECT BAR WITHIN A LEADFRAME

(71) Applicant: Amkor Technology, Inc., Chandler, AZ (US)

(72) Inventors: Sung Gyu Kim, Ulsan (KR); Byong Jin Kim, Gyeonggi-do (KR); Gi Jeong Kim, Gyeonggi-do (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 13/750,532

(22) Filed: Jan. 25, 2013

(65) Prior Publication Data

US 2013/0264694 A1 Oct. 10, 2013

(30) Foreign Application Priority Data

Apr. 9, 2012 (KR) .................. 10-2012-0036963

(51) Int. Cl.
*H01L 23/495* (2006.01)
*H01L 21/56* (2006.01)
*H01L 23/00* (2006.01)
*H01L 23/31* (2006.01)

(52) U.S. Cl.
CPC .............. *H01L 21/56* (2013.01); *H01L 23/495* (2013.01); *H01L 23/3107* (2013.01); *H01L 24/97* (2013.10); *H01L 2224/32245* (2013.01); *H01L 2224/48247* (2013.01); *H01L 2224/49109* (2013.01); *H01L 2224/73265* (2013.01); *H01L 2224/92247* (2013.01); *H01L 2224/97* (2013.01); *H01L 23/49513* (2013.01); *H01L 23/49541* (2013.01); *H01L 23/49551* (2013.01); *H01L 23/49558* (2013.01)

(58) Field of Classification Search
USPC .......... 257/666, 667, 669, 670, 673, 674, 676
See application file for complete search history.

(56) References Cited

U.S. PATENT DOCUMENTS

| 5,258,331 A * | 11/1993 | Masumoto et al. ............. 29/827 |
| 5,446,080 A * | 8/1995 | Shima et al. .................... 524/99 |
| 2009/0072366 A1 * | 3/2009 | Badakere Govindaiah et al. ............................ 257/676 |

* cited by examiner

*Primary Examiner* — Thanh V Pham
(74) *Attorney, Agent, or Firm* — Kevin B. Jackson

(57) ABSTRACT

In one embodiment, a semiconductor device includes a leadframe structure. A semiconductor die is attached to a die pad. Land connect bars are spaced apart from the die pad and a plurality of lands are between the land connect bars and the die pad and are spaced apart therefrom. Insulation members are adhered to the land connect bars and the plurality of lands to hold the land connect bars and the plurality of lands together and to electrically isolate them. An encapsulant covers the semiconductor die and at least portions of the plurality of lands, the die pad, and the land connect bars and further fills spaces between the land connect bars and the plurality of lands.

20 Claims, 7 Drawing Sheets

US 9,029,992 B2

ELECTRONIC PACKAGE STRUCTURE WITH INSULATED ADHESION PORTION FOR AFFIXING AND ISOLATING LANDS SPACED APART FROM LAND CONNECT BAR WITHIN A LEADFRAME

CROSS-REFERENCE TO RELATED APPLICATIONS

This application claims priority to Korean Patent Application 10-2012-0036963 filed on Apr. 9, 2012, which is expressly incorporated by reference herein.

BACKGROUND

The present invention relates to electronic devices, and more specifically to electronic device package structures and methods of fabricating the same.

Electronic devices, such as semiconductor dies are conventionally enclosed in plastic packages that protect the semiconductor die from hostile environments and that enable electrical interconnection between the semiconductor die and a next level of assembly, such as a printed circuit board (PCB) or motherboard. The elements of a typical semiconductor package include a conductive leadframe, an integrated circuit or semiconductor die, bonding material to attach the semiconductor die to the leadframe, bond wires that electrically connect pads on the semiconductor die to individual leads of the leadframe, and a hard plastic encapsulant material that covers the other components and that forms an exterior of the semiconductor package commonly referred to as the package body.

The conductive leadframe is a central supporting structure of such a semiconductor package, and is typically fabricated by chemically etching or mechanically stamping a metal strip. A portion of the leadframe is internal to the package and is surrounded by the plastic encapsulant or package body. Portions of the leads of the leadframe can extend externally from the package body and/or can be partially exposed therein for use in electrically connecting the package to another component. A portion of the die pad of the leadframe can also remain exposed within the package body.

In certain semiconductor packages, support structures, which are commonly referred to as land connect bars, provide temporary support for at least a portion of the internal lands or leads during the assembly fabrication process. Such support structures must be removed after the encapsulation step in order for certain of the leads to be electrically isolated from each other and from other structures. In one related method, a mechanical sawing process is used to cut a groove into the semiconductor package structure to physically remove the support structures thereby electrically isolating the leads. However, the mechanical sawing process adds an additional processing step, which results in increased costs and manufacturing time.

Accordingly, it would be desirable to have an electronic package structure and method that provides support for internal structures during the assembly fabrication process, and that further provides for electrical isolation of internal structures without having to use a mechanical removal step, such as a sawing process.

BRIEF DESCRIPTION OF THE DRAWINGS

FIG. 1b illustrates a bottom view of the semiconductor device of FIG. 1a;

FIG. 1c illustrates a cross-sectional view of the semiconductor device of FIG. 1a;

For simplicity and clarity of illustration, elements in the figures are not necessarily drawn to scale, and the same reference numbers in different figures denote generally the same elements. Additionally, descriptions and details of well-known steps and elements may be omitted for simplicity of the description.

DETAILED DESCRIPTION OF THE DRAWINGS

Figure 1A:
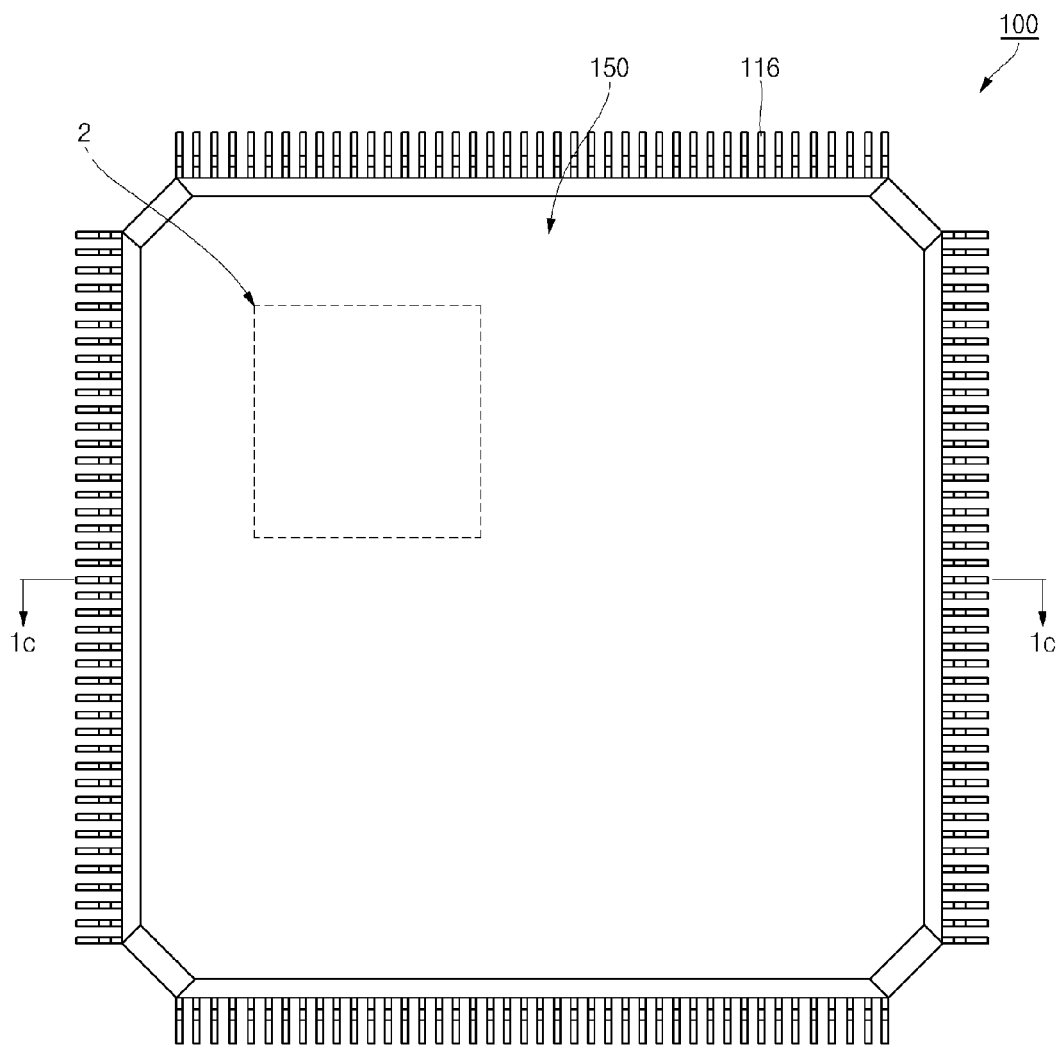
FIG. 1a illustrates a plan view of a semiconductor device in accordance with an embodiment of the present invention.
Figure 1B:
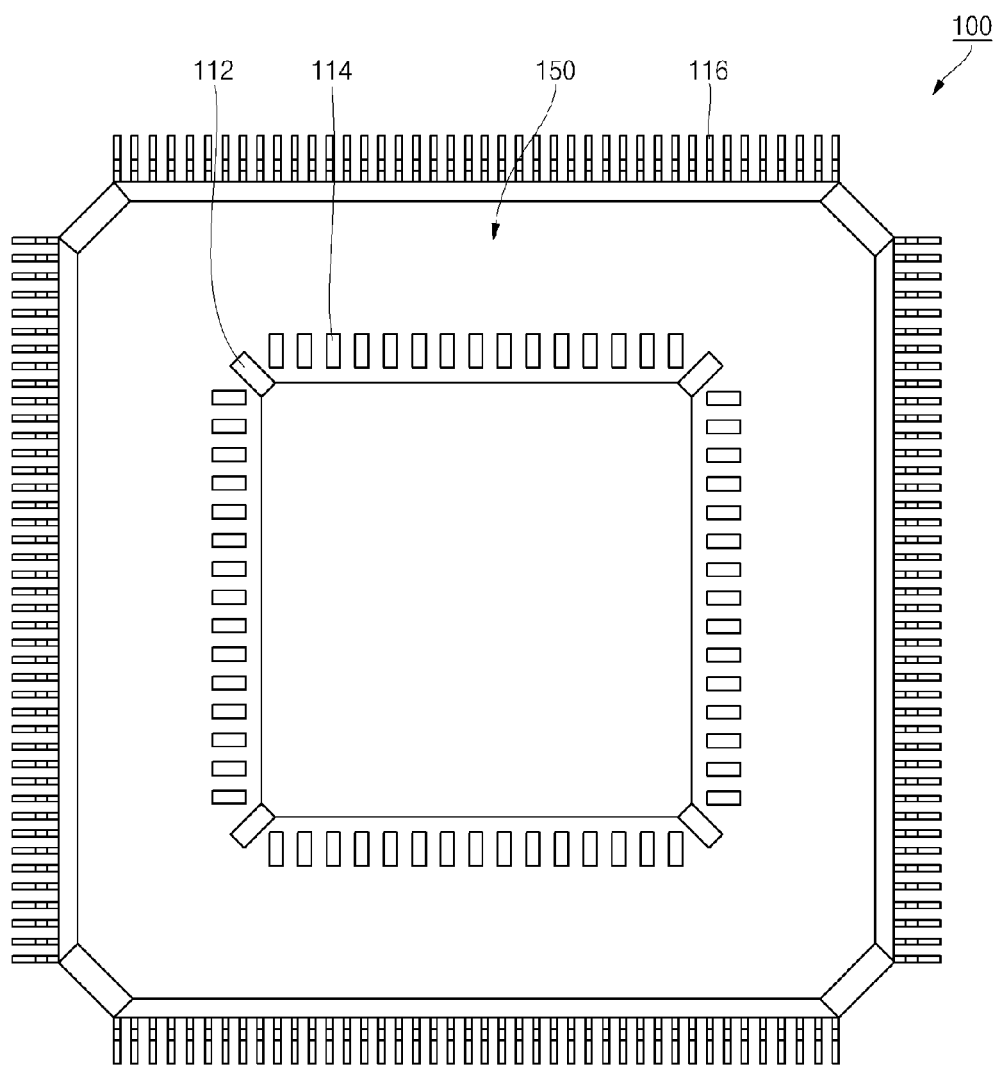
Figure 1C:
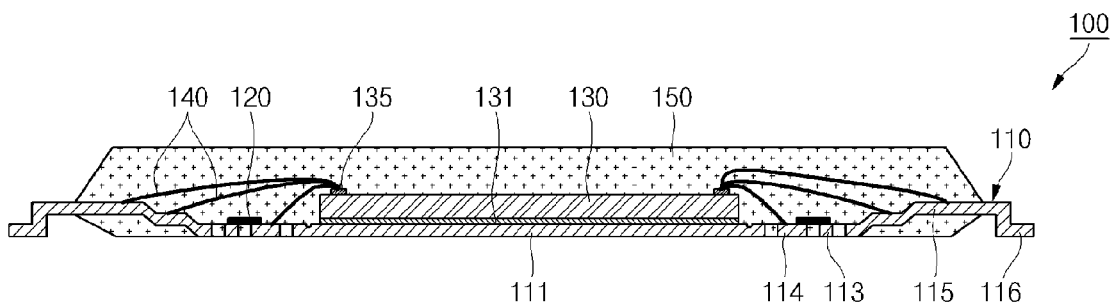
Figure 2:
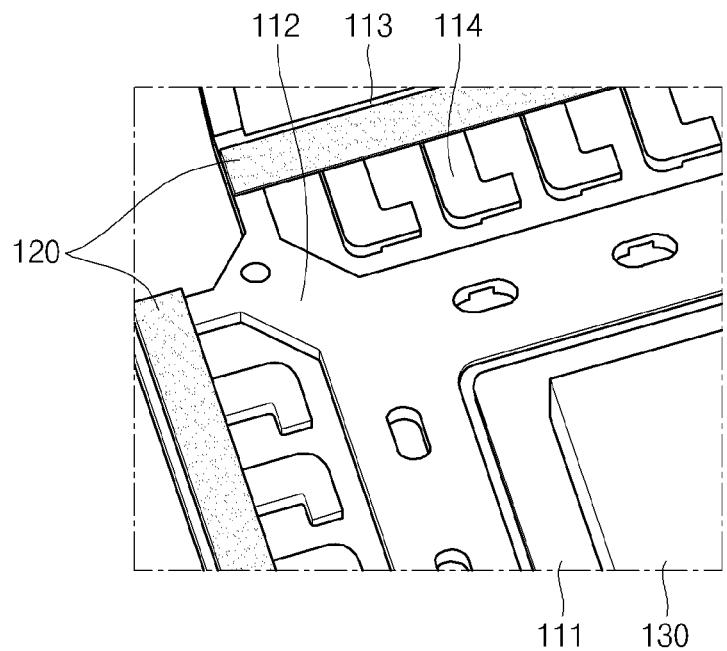
FIG. 2 illustrates a cut-away perspective view of the semiconductor device of FIG. 1a illustrating a portion of the internal structure thereof.

FIG. 1a illustrates a plan view of an electronic device or semiconductor device 100 according to a first embodiment. FIG. 1b illustrates a bottom view of the semiconductor device of FIG. 1a, and FIG. 1c illustrates a cross-sectional view of the semiconductor device taken along the line 1c-1c of FIG. 1a. Hereinafter, the semiconductor device according to the first embodiment will be described with reference to FIGS. 1a, 1b, 1c and 2.

As illustrated in FIGS. 1a, 1b, 1c, and 2 and in accordance with the first embodiment, a semiconductor device 100 includes a leadframe 110, insulation members 120, a semiconductor die 130, conductive wires 140 and an encapsulant 150. In one embodiment, leadframe 110 can include a die pad 111, tie bars 112, land connect bars 113, a plurality of lands 114, a plurality of internal leads 115, and a plurality of external leads 116. Die pad 111 can be shaped as a substantially rectangular plate and can have four sides and four corners. In one embodiment, an adhesive agent can be added to die pad 111 in the manufacturing process so that semiconductor die 130 can be adhered to die pad 111.

In one embodiment, tie bars 112 can be formed to outwardly protrude a predetermined length from the four corners of the die pad 111. In one embodiment, tie bars 112 can extend in generally diagonal directions as well as in the outward directions from the four corners of the die pad 111. Land connect bars 113 can be spaced apart from the die pad 111 and can be formed along the outer circumference of the die pad 111. In one embodiment, land connect bars 113 can have a substantially rectangular ring shape and are spaced apart from the four sides and four corners of die pad 111. In accordance with the present embodiment, insulation members 120 are adhered to top surfaces of land connect bars 113. In general, insulation members 120 are configured to adhere and affix various components of semiconductor device 100 together and to electrically isolate these various components from each other. In one embodiment, land connect bars 113 may further include land support bars that connect tie bars 112 to land connect bars 113.

In the present embodiment, plurality of lands 114 are spaced apart from the four sides of die pad 111 and extend outwardly from die pad 111 by a predetermined length. In addition, plurality of lands 114 can be formed along the four corners of the die pad 111 and spaced apart from each other. In accordance with the present embodiment, plurality of lands 114 are spaced apart from die pad 111 and spaced apart from land connect bars 113 between the four sides of die pad 111 and the ring-shaped land connect bars 113 so that these structures are separate and not electrically connected.

In one embodiment, plurality of lands 114 include wire bonding regions on top surfaces that are adjacent to semiconductor die 130 and that are electrically connected thereto using, for example, conductive wires 140. In accordance with the present embodiment, insulation members or insulating attachment members 120 are adhered and affixed to the top surfaces of plurality of lands 114 that are opposite to the wire bonding regions and adjacent to land connect bars 113 thereby connecting plurality of lands 114 to land connect bars 113. That is, insulation members 120 are configured to adhere and affix plurality of lands 114 to land connect bars 113 together, which are spaced apart from each other. Further, insulation members 120 electrically isolate plurality of lands 114 from land connect bars 113.

As illustrated in FIG. 1b, surfaces, such as bottom surfaces of plurality of lands 114 can be exposed through a lower surface of the encapsulant 150. In one embodiment, encapsulant 150 surrounds the other surfaces of plurality of lands 114 so that the bottom surfaces of plurality of lands 114 are substantially coplanar with the lower surface of encapsulant 150. In one embodiment, outer peripheral surfaces adjoining the exposed surfaces of plurality of lands 114 can be surrounded by encapsulant 150. In this embodiment, plurality of lands 114 is configured to be surface-mount attached to a next level of assembly using, for example, a soldering process. In one embodiment, plurality of lands 114 may further include locking protrusions to increase the coupling force or adhesion with encapsulant 150. In one embodiment, portions of the bottom surfaces of plurality of lands 114 can be half-etched to form the locking protrusions.

As illustrated in FIG. 1c, plurality of internal leads 115 are spaced apart from land connect bars 113 and extend outwardly therefrom by a predetermined length. Plurality of internal leads 115 can be formed along four sides of land connect bars 113 and can be spaced apart from each other. In one embodiment, plurality of internal leads 115 are connected to plurality of external leads 116, and in one embodiment, and plurality of leads 115 are positioned inside encapsulant 150. Plurality of internal leads 115 can include one or more upwardly bent downsets and are provided with wire bonding regions on top surfaces thereof to be electrically bonded to conductive wires 140.

In one embodiment, plurality of external leads 116 extend outwardly from encapsulant 150 by a predetermined length, and each of plurality of external leads 116 is electrically connected to one of plurality of internal leads 115. Plurality of internal leads 115 are configured to receive electrical signals through conductive wires 140 and are further configured to transfer the electrical signals to an external device through plurality of external leads 116. In one embodiment, plurality of external leads 116 can be surface-mount attached or through-mount attached onto the external device using, for example, a soldering process.

In accordance with the present embodiment, insulation members 120 are adhered to top surfaces of plurality of lands 114 and land connect bars 113 within leadframe 110, thereby affixing plurality of lands 114 to land connect bars 113. Insulation members 120 can be adhered to top surfaces of plurality of lands 114 and land connect bars 113, which are spaced apart from each other, and encapsulant 150 is inserted into or placed within spaces between plurality of lands 114 and land connect bars 113 and overlapped by insulation members 120 to electrically isolate plurality of lands 114 from land connect bars 113. In one embodiment, insulation members 120 are positioned inside or within encapsulant 150. In one embodiment, insulation members 120 are adhered to adjacent top surfaces of land connect bars 113 and plurality of lands 114. By way example, insulation members 120 can be adhesive agents, tapes made of epoxy, and other related or equivalent materials as known by one of ordinary skill in the relevant art.

Semiconductor die 130 can be attached to the top surface of die pad 111 within leadframe 110 using an adhesive agent 131. In one embodiment, a plurality of bond pads 135 are formed on a top surface of the semiconductor die 130 and plurality of bond pads 135 of the semiconductor die 130 can be wire-bonded to conductive wires 140. Conductive wires 140 electrically connect bond pads 135 of semiconductor die 130 to plurality of lands 114 within leadframe 110, and electrically connect bond pads 135 of semiconductor die 130 to plurality of internal leads 115 within leadframe 110.

In one embodiment, encapsulant 150 encapsulates or covers leadframe 110, insulation members 120, semiconductor die 130 and conductive wires 140 to protect them from external surroundings. In one embodiment, plurality of external leads 116 of leadframe 110 can protrude from side surfaces of encapsulant 150 and can extend a predetermined length therefrom. In one embodiment, plurality of external leads 116 can be bent to a desired shape. In one embodiment, plurality of lands 114 is exposed through one side, such as bottom side of encapsulant 150. Die pad 111 and tie bars 112 may also be exposed through the bottom side of the encapsulant 150. In this configuration, the bottom surface of encapsulant 150 and those portions of leadframe 110 exposed through bottom side of the encapsulant 150 are substantially coplanar with respect to each other. In addition, others surfaces of die pad 111, tie bars 112, and plurality of lands 114 not exposed through the bottom surface of encapsulant 150 are surrounded by encapsulant 150.

In summary, because plurality of lands 114 and land connect bars 113 are affixed together and electrically isolated by insulation members 120 adhered to leadframe 110, it is not necessary to perform a separate sawing process to electrically isolate plurality of lands 114 from land connect bars 113 as in previous devices. Thus, the fabrication process of semiconductor device 100 is simplified and processing cost and time is reduced.

Figure 3:
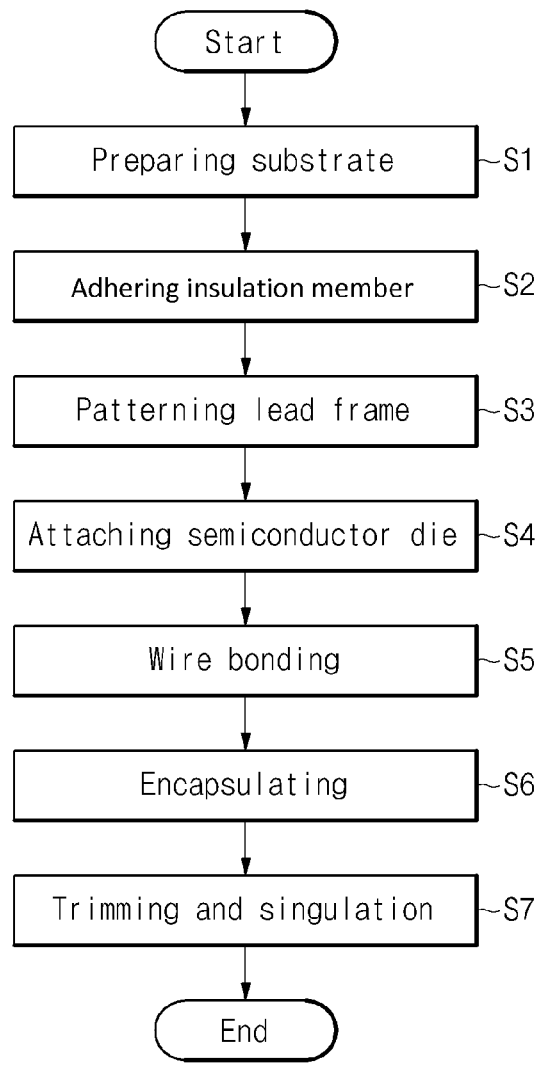
FIG. 3 is a flowchart illustrating a method of fabricating the semiconductor device of FIGS. 1a-1c in accordance with an embodiment of the present invention.

FIG. 3 illustrates a flowchart diagram of a method for fabricating the semiconductor device of FIGS. 1a to 1c in accordance with the one embodiment. As shown in FIG. 3, the fabricating method includes the steps of preparing a substrate (S1), adhering insulation members (S2), patterning a leadframe using, for example, etching and downsetting (S3), attaching a semiconductor die (S4), wire bonding (S5), encapsulating (S6) and trimming and singulation (S7).

Figure 4A:
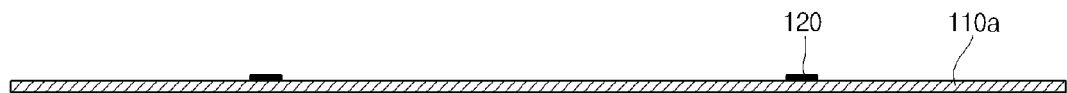
FIGS. 4a to 4f illustrate cross-sectional views of a semiconductor device fabricated in accordance with method illustrated in FIG. 3.

FIGS. 4a to 4g illustrate cross-sectional views of a semiconductor device in various stages of fabrication in accordance with the fabricating method of FIG. 3. As illustrated in FIG. 4a, in the step of preparing the substrate (S1), a metal substrate 110a for forming a leadframe is provided. In one embodiment, metal substrate 110a can have a plate-like shape. In the step of adhering the insulation members (S2), insulation members 120 are adhered or attached to a top surface of metal substrate 110a in a location where plurality of lands 114 and land connect bars 113 of leadframe 110 are to be formed.

Figure 4B:
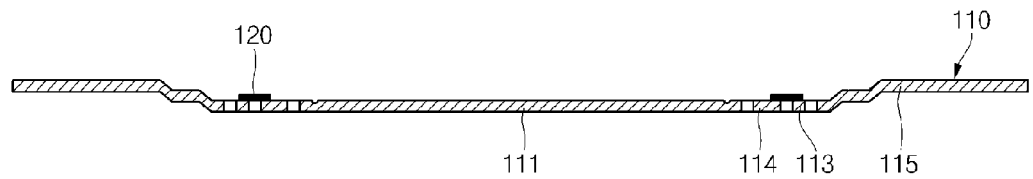

Referring to FIG. 4b, in the step of patterning the leadframe (S3), the metal substrate 110a having the insulation members 120 adhered thereto is etched to pattern metal substrate 110a, and tie bars (not shown) and plurality of internal leads 115 are then downset to form leadframe 110. In one embodiment, leadframe 110 includes die pad 111, tie bars that outwardly extend from respective corners of die pad 111, land connect bars 113 formed along the outer periphery of die pad 111, plurality of lands 114 affixed to land connect bars 113 through insulation members 120, plurality of internal leads 115 formed on dam bars (not shown) that connect the tie bars to each other, and plurality of external leads 116 outwardly formed at locations of the dam bars corresponding to the plurality of internal leads 115.

In one embodiment, leadframe 110 can be formed by patterning a major surface of metal substrate 110a by a direct image method using, for example, a laser or plasma etching. In accordance with the present embodiment, insulation members 120, which are adhered to the top surface of leadframe 110, are configured to affix plurality of lands 114 to land connect bars 113 after being separated by the leadframe patterning step (S3) and to electrically isolate these elements from each other.

Figure 4C:
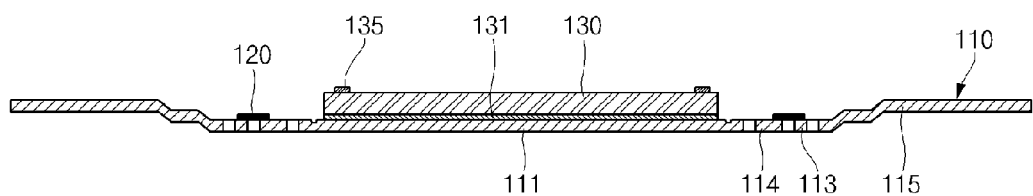

As illustrated in FIG. 4c, in the step of attaching the semiconductor die (S4), semiconductor die 130 having plurality of bond pads 135 formed thereon can be attached to die pad 111 of leadframe 110 using an adhesive agent 131. By way of example, adhesive agent 131 can be a liquid-phase epoxy adhesive agent, an adhesive film, an adhesive tape, and other related or equivalent materials as known by one of ordinary skill in the relevant art.

Figure 4D:
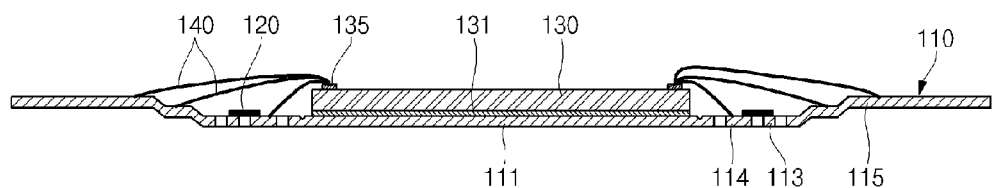

As illustrated in FIG. 4d, in the step of wire bonding (S5), semiconductor die 130 and leadframe 110 are electrically connected to each other using, for example, conductive wires 140. In one embodiment, conductive wires 140 electrically connect bond pads 135 on semiconductor die 130 and plurality of lands 114 of leadframe 110, and bond pads 135 of semiconductor die 130 and plurality of internal leads 115 of leadframe 110.

Figure 4E:
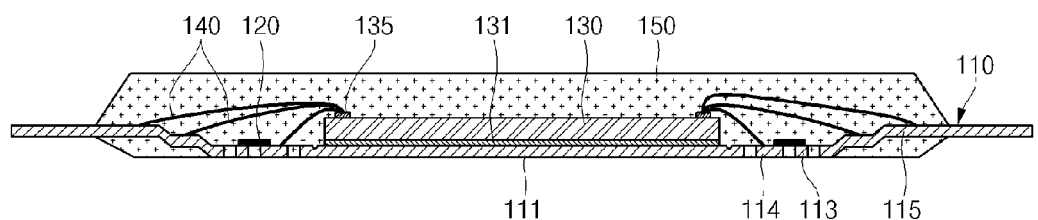

As illustrated in FIG. 4e, in the step of encapsulating (S6), leadframe 110, insulation members 120, semiconductor die 130 and conductive wires 140 are encapsulated by encapsulant 150. Encapsulant 150 also fills spaces between plurality of lands 114 and land connect bars 113 that are also overlapped by insulation members 120. In one embodiment, the encapsulating step can be performed on only interior regions of the dam bars (not shown) of leadframe 110 so that plurality of external leads 116 and the dam bars outwardly protrude from the side of the encapsulant 150. In one embodiment, encapsulant 150 is configured to encapsulate die pad 111 and plurality of lands 114 such that bottom surfaces of die pad 111 and plurality of lands 114 are exposed through bottom surface of encapsulant 150.

Figure 4F:
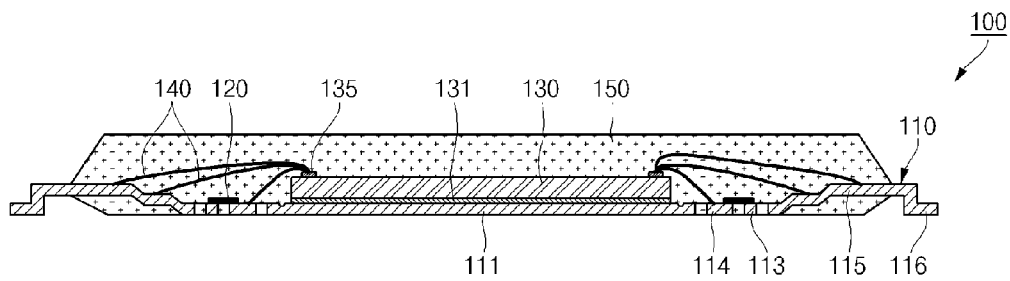

As illustrated in FIG. 4f, in the step of trimming (S7), the dam bars (not shown), which connect plurality of external leads 116 and plurality of internal leads 115, are removed thereby allowing the respective leads to be electrically isolated from each other. In addition, plurality of external leads 116 protruding through the side surfaces of encapsulant 150 can be formed into a predetermined shape to allow plurality of external leads 116 to be mountable to an external device. In addition, after forming plurality of external leads 116, tie bars 112 protruding from encapsulant 150 and connecting the respective semiconductor devices into an assembly are cut, thereby singulating the assembly into individual semiconductor devices 100.

In accordance with the present embodiment, insulation members 120, which can be affixed to metal substrate 110a before it is patterned to form leadframe 110, are configured to affix and electrically isolate plurality of lands 114 from land connect bars 113. Thus, it is not necessary to perform a separate sawing process to disconnect and electrically isolate plurality of lands 114 from land connect bars 113 after the encapsulation step is performed, and the fabrication process of semiconductor device 100 is thereby simplified and the processing cost and time is reduced.

Figure 5:
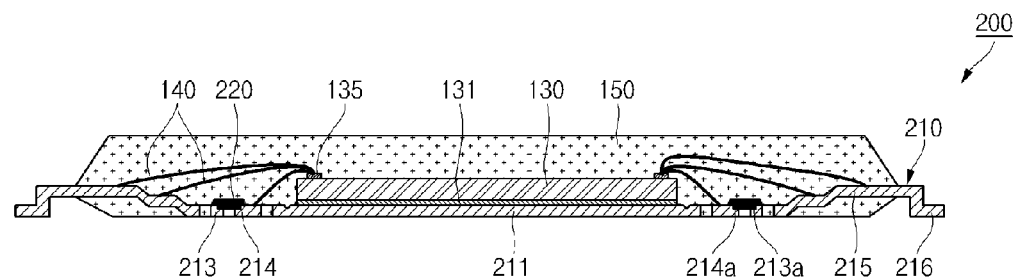
FIG. 5 illustrates a cross-sectional view of a semiconductor device in accordance with another embodiment of the present invention.

FIG. 5 illustrates a cross-sectional view of a semiconductor device 200 in accordance with another embodiment. In one embodiment, semiconductor device 200 includes a leadframe 210, insulation members 220, semiconductor die 130, conductive wires 140 and encapsulant 150. The configurations of semiconductor die 130, conductive wires 140 and encapsulant 150 in semiconductor device 200 can be similar to semiconductor device 100. In addition, leadframe 210 of semiconductor device 200 includes a die pad 211, tie bars 212, a plurality of internal leads 215 and a plurality of external leads 216, which are similar to corresponding components of leadframe 110 of semiconductor device 100. Therefore, the following description of semiconductor device 200 highlights land connect bars 213, a plurality of lands 214, and insulation members 220 of the lead frame 210, which are different from corresponding components of semiconductor device 100.

In one embodiment, land connect bars 213 can be spaced apart from die pad 211 and are formed along the outer circumference of die pad 211. In one embodiment, land connect bars 213 can have a substantially rectangular ring shape and are spaced apart from the four sides and four corners of die pad 211. In another embodiment, land connect bars 213 can further include land support bars configured to connect tie bars (not shown) to land connect bars 213. In accordance with the present embodiment, land connect bars 213 include half etched portions or recessed portions 213a downwardly formed from top surfaces of sides of land connect bars 213 adjacent to die pad 211 to a predetermined depth, so that the top surfaces of land connect bars 213 have stepped portions. Half etched portions 213a can be formed, for example, during an etching process used to pattern leadframe 210 from a metal substrate. In one embodiment, half etched portions 213a are formed on sides that are interior sides of land connect bars 213 adjacent to die pad 211 and adjacent to the top surfaces of land connect bars 213. In addition, exterior sides of land connect bars 213, which are opposite to the interior sides, are adjacent to plurality of internal leads 215. In the present embodiment, insulation members 220 are adhered or affixed to the stepped top surfaces of land connect bars 213. For example, insulation members 220 can be adhered or affixed to half etched portions 213a and portions of the top surfaces of land connect bars 213 adjacent thereto. In accordance with the present embodiment, half etched portions 213a are configured to facilitate the affixing of insulation members 220 to land connect bars 213.

In one embodiment, plurality of lands 214 are spaced apart from the four sides of die pad 211 and extend outwardly from die pad 211 by a predetermined length. In addition, plurality of lands 214 can be formed along the four sides of die pad 211 and are spaced apart from each other. In accordance with the present embodiment, plurality of lands 214 are spaced apart from die pad 211 and land connect bars 213 between the four sides of die pad 211 and the ring-shaped land connect bars 213 so that these structures are separate and not electrically connected.

In one embodiment, plurality of lands 214 have wire bonding regions on top surfaces that are adjacent to semiconductor die 130 and are electrically connected thereto using, for example, conductive wires 140. In accordance with the present embodiment, plurality of lands 214 include half etched portions or recessed portions 214a downwardly formed from top surfaces of plurality of lands 214 adjacent land connect bars 213 to a predetermined depth, so that the top surfaces of plurality lands 214 have stepped portions. Half etched portions 214a can be formed, for example, during an etching process used to pattern leadframe 210 from a metal substrate. In accordance with the present embodiment, insulation members 220 are adhered or affixed to the half etched portions 214a and portions of the top surfaces of plurality lands 214 adjacent thereto, thereby allowing the plurality of lands 214 to be affixed to each other.

In addition, insulation members 220 are configured to adhere and affix plurality of lands 214 to land connect bars 213 together and to electrically isolate them from each other. That is, plurality of lands 214 are spaced apart from land connect bars 213 to that they are electrically isolated and are attached together by insulation members 220 adhered to the top surfaces of plurality of lands 214 and land connect bars 213. In accordance with the present embodiment, half etched portions 214a are configured to facilitate the affixing of insulation members 220 to plurality of lands 214.

In one embodiment, surfaces, such as bottom surfaces of plurality of lands 214 can be exposed through the lower surface of encapsulant 150 and can be substantially co-planar with the lower surface of encapsulant 150 as illustrated in FIG. 5. Other surfaces of plurality of lands 214 can be surrounded by encapsulant 150. In one embodiment, outer peripheral surfaces adjoining the exposed surfaces of plurality of lands 214 can be surrounded by encapsulant 150. In one embodiment, plurality of lands 214 can be configured to be surface-mount attached to an external device using, for example, a soldering process. In one embodiment, at least a portion of plurality of lands 214 can include locking protrusions that increase the coupling force or adhesion with encapsulant 150. The locking protrusions can be formed in the bottom surfaces of plurality of lands 214 using, for example, a half etch process.

In accordance with the present embodiment, insulation members 220 are adhered to top surfaces of plurality of lands 214 and land connect bars 213 in leadframe 210. Insulation members 220 connect plurality of lands 214 to land connect bars 213 to each other and connect plurality of lands 214 to each other. Insulation members 220 are adhered to half etched portions 213a of land connect bars 213 and half etched portions 214a of plurality of lands 214, which are spaced apart from each other. In addition, insulation members 220 can be adhered to cover regions stepped with respect to top surfaces of land connect bars 213 and regions stepped with respect to top surfaces of plurality of lands 214.

Encapsulant 150 is formed within spaces between plurality of lands 214 and land connect bars 213 that are overlapped by insulation members 220 to electrically isolate plurality of lands 214 from land connect bars 213. In the present embodiment, insulation members 220 are positioned inside of or enclosed within encapsulant 150. By way example, insulation members 220 can be adhesive agents, tapes made of epoxy, and other related or equivalent materials as known by one of ordinary skill in the relevant art.

Figure 6:
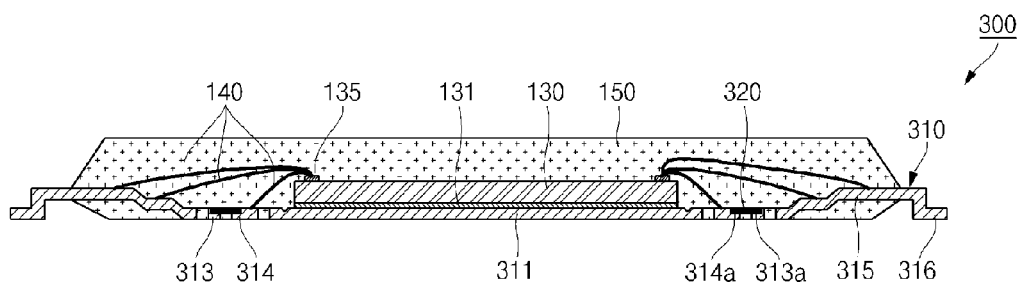
FIG. 6 illustrates a cross-sectional view of a semiconductor device in accordance with a further embodiment of the present invention.

FIG. 6 illustrates a cross-sectional view of a semiconductor device 300 according to further embodiment. Semiconductor device 300 includes a lead frame 310, insulation members 320, semiconductor die 130, conductive wires 140 and encapsulant 150. Semiconductor device 300 is similar to semiconductor device 100 and semiconductor device 200, and only the pertinent differences between semiconductor device 300 and semiconductor devices 100 and 200 will be described.

In one embodiment, land connect bars 313 have a substantially rectangular ring shape and are spaced apart from the four sides and four corners of a die pad 311. In one embodiment, land connect bars 313 are spaced apart from die pad 311 and are formed along the outer circumference of die pad 311. In another embodiment, land connect bars 313 can further include land support bars for connecting tie bars (not shown) to land connect bars 313. In accordance with the present embodiment, land connect bars 313 include half etched portions or recessed portions 313a downwardly formed from top surfaces of land connect bars that are adjacent die pad 311 to a predetermined depth, so that the top surfaces of land connect bars 313 have stepped portions. By way of example, half etched portions 313a can be formed during an etching process used to pattern leadframe 310 from a metal substrate. In one embodiment, half etched portions 313a can be formed on interior sides of the land connect bars 313 adjacent to die pad 311 so as to extend downward from the top surfaces of the land connect bars 313.

In addition, exterior sides of land connect bars 313, which are opposite to the interior sides, are adjacent to plurality of internal leads 315. In the present embodiment, insulation members 320 are adhered and affixed to the top surfaces of half etched portions 313a to connect land connect bars 313 to plurality of lands 314. In accordance with the present embodiment, insulation members 320 are adhered to the top surfaces of half etched portions 313a so that the top surfaces of the insulation members 320 are substantially coplanar with the adjoining top surfaces of land connect bars 313. That is, the top surfaces of land connect bars 313 that adjoin half etched portions 313a are substantially coplanar with the top surfaces of insulation members 320. In accordance with the present embodiment, half etched portions 313a are configured to facilitate the affixing of insulation members 320 to land connect bars 313.

In one embodiment, plurality of lands 314 are spaced apart from the four sides of die pad 311 and extend outwardly from die pad 311 by a predetermined length. In addition, plurality of lands 314 can be formed along the four sides of die pad 311 and are spaced apart from each other. In accordance with the present embodiment, plurality of lands 314 are spaced apart from die pad 311 and land connect bars 313 between the four sides of die pad 311 and the ring-shaped land connect bars 313 so that these structures are separate and not electrically connected.

In one embodiment, plurality of lands 314 have wire bonding regions on top surfaces that are adjacent to semiconductor die 130 and are electrically connected thereto using, for example, conductive wires 140. In accordance with the present embodiment, plurality of lands 314 include half etched portions or recessed portions 314a downwardly formed from top surfaces of plurality of lands 314 adjacent to land connect bars 313 to a predetermined depth, so that top surfaces of the lands 314 have stepped portions. Half etched portions 314a can be formed, for example, during an etching process used to pattern leadframe 310 from a metal substrate. In accordance with the present embodiment, insulation members 320 are adhered and affixed to half etched portions 314a. In one embodiment, insulation members 320 are adhered and affixed to the top surfaces of half etched portions 314a of plurality of lands 314, so that the top surfaces of insulation members 320 are substantially coplanar with the adjoining top surfaces of plurality of lands 314. That is, the top surfaces of plurality of lands 314 that adjoin half etched portions 314a are substantially coplanar with the top surfaces of insulation members 320.

In the present embodiment, insulation members 320 are configured to adhere and affix plurality of lands 314 to land connect bars 313 together and to electrically isolate them from each other. That is, plurality of lands 314 are spaced apart from land connect bars 313 so that they are electrically isolated and are attached together by insulation members 320 attached and affixed to half etched portions 313a and 314a. In accordance with the present embodiment, half etched portions 314a are configured to facilitate the affixing of insulation members 320 to plurality of lands 314.

In one embodiment, surfaces, such as bottom surfaces of plurality of lands 314 can be exposed through the lower surface of encapsulant 150 and can be substantially co-planar with the lower surface of encapsulant 150 as illustrated in FIG. 6. Other surfaces of plurality of lands 314 can be surrounded by encapsulant 150. In one embodiment, outer peripheral surfaces adjoining the exposed surfaces of plurality of lands 314 can be surrounded by encapsulant 150. In one embodiment, plurality of lands 314 can be configured to be surface-mount attached to an external device using, for example, a soldering process. In one embodiment, at least a portion of plurality of lands 314 can include locking protrusions that increase the coupling force or adhesion with encapsulant 150. The locking protrusions can be formed in the bottom surfaces of plurality of lands 314 using, for example, a half etch process.

In accordance with the present embodiment, insulation members 320 are adhered and affixed to top surfaces of half etched portions 314a of plurality of lands 314 and half etched portions 313a of land connect bars 313, which are spaced apart within leadframe 310. In accordance with the present embodiment, the top surfaces of insulation members 320 are substantially coplanar with the top surfaces of land connect bars 313 adjoining half etched portions 313a and substantially co-planar with the top surfaces of the plurality of lands 314 adjoining half etched portions 314a. That is, insulation members 320 are formed in or placed within grooves formed by half etched portions 313a and the half etched portions 314a. Insulation members 320 are formed or accommodated in the grooves formed by land connect bars 313 and plurality of lands 314, thereby facilitating fixing of land connect bars 313 and plurality of lands 314.

Encapsulant 150 is inserted into or formed within spaces between plurality of lands 314 and land connect bars 313 that are overlapped by insulation members 320 to electrically isolate plurality of lands 314 from and connect bars 313. In the present embodiment, insulation members 320 are positioned inside of or enclosed within encapsulant 150. By way example, insulation members 320 can be adhesive agents, tapes made of epoxy, and other related or equivalent materials as known by one of ordinary skill in the relevant art.

Figure 7:
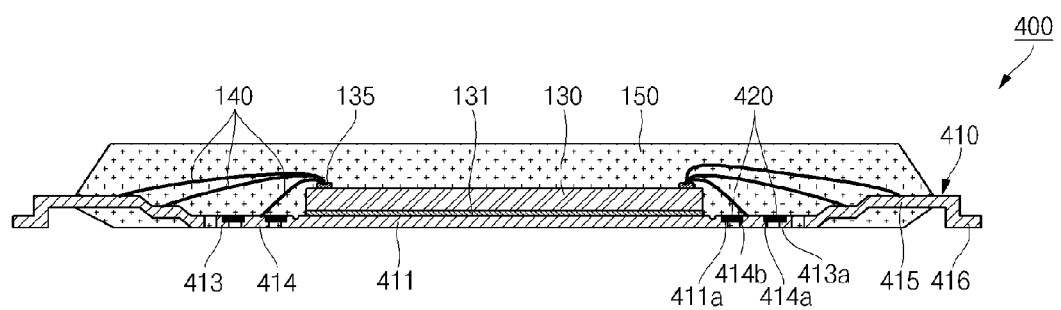
FIG. 7 illustrates a cross-sectional view of a semiconductor device in accordance with a still further embodiment of the present invention.
Figure 8:
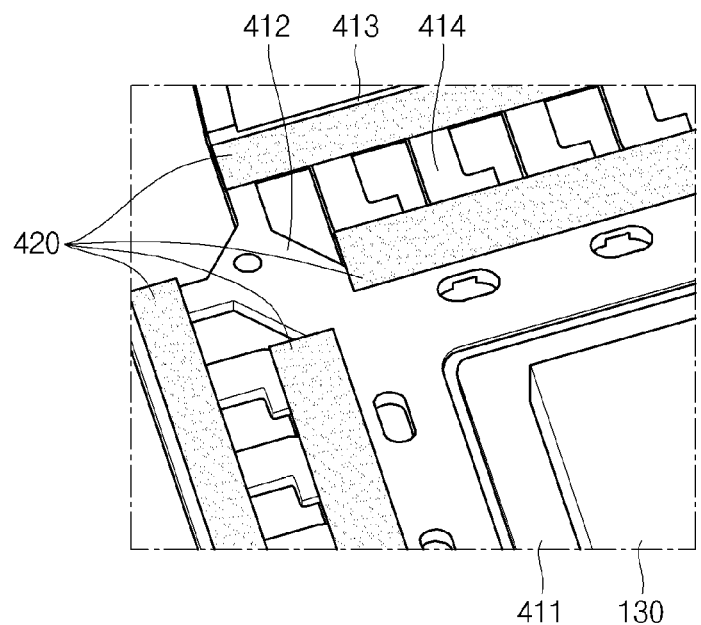
FIG. 8 illustrates a cut-away perspective view of the semiconductor device of FIG. 7 illustrating a portion of the internal structure thereof.

FIG. 7 illustrates a cross-sectional view of a semiconductor device 400 according to a still further embodiment. FIG. 8 is a cut-away perspective view of semiconductor device 400 illustrating a portion of the internal structure thereof. In one embodiment, semiconductor device 400 includes a leadframe 410, insulation members 420, semiconductor die 130, conductive wires 140 and encapsulant 150. Semiconductor device 400 is similar to semiconductor devices 100, 200, and 300, and only pertinent differences between semiconductor device 400 and semiconductor devices 100, 200 and 300 will be described. The following description of semiconductor device 400 will focus on a die pad 411, a plurality of lands 414 and insulation members 420 of leadframe 410, which are different from corresponding components of semiconductor devices 100, 200 and 300.

In one embodiment, die pad 411 can be substantially rectangular shaped plate and can have four sides and four corners. An adhesive agent can be applied to a central portion of die pad 411 and used to attach semiconductor die 130 to die pad 411. In accordance with the present embodiment, die pad 411 includes half etched portions or recessed portions 411a, which can be formed adjacent outer peripheral edges of die pad 411. In one embodiment, half etched portions 411a can be downwardly formed from a top surface of die pad 411 to a predetermined depth, so that the top surface of die pad 411 has stepped portions formed therein. In one embodiment, half etched portions 411a can be formed during an etching process used to pattern and form leadframe 410 from a metal substrate. In the present embodiment, insulation members 420 are adhered and affixed to top surfaces of the half etched portions 411a and insulation members 420 further connect die pad 411 to plurality of lands 414. In accordance with the present embodiment, insulation members 420 are adhered and affixed to the top surfaces of half etched portions 411a of the die pad 411 and the top surfaces of insulation members 420 are substantially coplanar with the top surface of the central portion of die pad 411, which has semiconductor die 430 adhered thereto. In accordance with the present embodiment, half etched portions 411a are configured to facilitate the affixing of insulation members 420 to die pad 411.

In one embodiment, plurality of lands 414 are spaced apart from the four sides of die pad 411 and extend outwardly from die pad 411 by a predetermined length. In addition, the plurality of lands 414 can be formed along the four sides of die pad 411 and are spaced apart from each other. In accordance with the present embodiment, plurality of lands 414 are spaced apart from die pad 411 and land connect bars 413 between the four sides of die pad 411 and the ring-shaped land connect bars 413 so that these structures are separate and not electrically connected.

In accordance with the present embodiment, plurality of lands 414 include half etched portions or recessed portions 414b downwardly formed from top surfaces of plurality of lands 414 to a predetermined depth adjacent to die pad 411. In addition, plurality of lands 414 include half etched portions 414a downwardly formed from top surfaces of plurality of lands 414 to a predetermined depth adjacent to land connect bars 413. Further, central portions of plurality of lands 414 between half etched portions 414a and 414b can be used as wire bonding regions to electrically connect semiconductor die 130 to plurality of lands 414 using, for example, conductive wires 140. In accordance with the present embodiment, plurality of lands 414 have stepped portions on opposing sides that are defined, for example, by half etched portions 414a and 414b.

Half etched portions 414a and 414b can be formed, for example, during an etching process used to pattern leadframe 410 from a metal substrate. In accordance with the present embodiment, insulation members 420 are adhered and fixed to both sides of plurality lands 414 using half etched portions 414a and 414b. In one embodiment, insulation members 420 are adhered and affixed to the top surfaces of half etch portions 414a and 414b of plurality of lands 414, so that the top surfaces of insulation members 420 are substantially coplanar with the adjoining top surfaces or wire bonding surfaces of plurality of lands 414.

In the present embodiment, insulation members 420 are configured to adhere and affix plurality of lands 414 to die pad 411 and to adhere and affix plurality of lands 414 to land connect bars 413. Insulation members 420 are configured to electrically isolate plurality of lands 414, die pad 411, and land connect bars from each other. In the present embodiment, plurality of lands 414 are placed between die pad 411 and land connect bars 413 and are spaced apart therefrom. In accordance with the present embodiment, half etched portions 414a and 414b are configured to facilitate the affixing of insulation members 420 to plurality of lands 414.

In one embodiment, surfaces, such as bottom surfaces of plurality of lands 414 can be exposed through the lower surface of encapsulant 150 and can be substantially co-planar with the lower surface of encapsulant 50 as illustrated in FIG. 7. Other surfaces of plurality of lands 414 can be surrounded by encapsulant 150. In one embodiment, outer peripheral surfaces adjoining the exposed surfaces of plurality of lands 414 can be surrounded by encapsulant 150. In one embodiment, plurality of lands 414 can be configured to be surface-mount attached to an external device using, for example, a soldering process. In one embodiment, at least a portion of plurality of lands 414 can include locking protrusions that increase the coupling force or adhesion with encapsulant 150. The locking protrusions can be formed in the bottom surfaces of plurality of lands 414 using, for example, a half etch process.

In accordance with the present embodiment, insulation members 420 are adhered to top surfaces of half etched portions 414a of plurality of lands 414 and half etched portions 413a of land connect bars 413, which are spaced apart from each other, to affix plurality of lands 414 to land connect bars 413 and to affix plurality of lands 414 to each other. Also, insulation members 420 are adhered to half etched portions 411a of the die pad 411 and half etched portions 414b of the plurality of lands 414, which are spaced apart from each other, to affix plurality of lands 414 to die pad 411. In the present embodiment, the top surfaces of insulation members 420 are substantially coplanar with a top surface of a central portion of die pad 411, the top surfaces of the land connect bars 413 adjoining half etched portions 413a and the top surfaces of the wire bonding regions of the plurality of lands 414 adjoining half etched portions 414a and 414b. That is, the insulation members 420 are formed in or placed within in grooves formed by half etched portions 411a of die pad 411 and half etched portions 414b of plurality of lands 414 and grooves formed by half etched portions 413a of land connect bars 413 and half etched portions 414a of plurality of lands 414. In accordance with this embodiment, insulation members 420 are configured to affix plurality of lands 414, die pad 411, and land connect bars 413 together.

Encapsulant 150 is inserted into or formed within spaces between plurality of lands 414 and die pad 411 that are overlapped by insulation members 420 to electrically isolate plurality of lands 414 from die pad 411. In addition, encapsulant 150 is inserted into or formed within spaces between plurality of lands 414 and land connect bars 413 that are overlapped by insulation members 420 to electrically isolate plurality of lands 414 from land connect bars 413. In the present embodiment, insulation members 420 are positioned inside of or enclosed within encapsulant 150. By way example, insulation members 420 can be adhesive agents, tapes made of epoxy, and other related or equivalent materials as known by one of ordinary skill in the relevant art.

From all of the foregoing, one skilled in the art can determine that according to one embodiment a semiconductor device structure (for example, elements 100, 200, 300, 400) includes a semiconductor die (for example, element 130) including a plurality of bond pads (for example, element 135). A leadframe (for example, element 110, 210, 310, 410) including a die pad (for example, elements 111, 211, 311, 411) has the semiconductor die mounted thereon, tie bars (for example, elements 112, 412) outwardly extend from corners of the die pad and a plurality of lands (for example, elements 114, 214, 314, 414) spaced apart from respective sides of the die pad. Insulation members (for example, elements 120, 220, 320, 420) are adhered to the plurality of lands connecting portions between the plurality of lands and conductive structures (for example, element 140) electrically connecting the plurality of lands to the plurality of bond pads. An encapsulant (for example, 150) encapsulating the leadframe, the semiconductor die, the insulation members and the conductive structures, wherein the plurality of lands are exposed through a surface of the encapsulant.

Those skilled in the art will also appreciate that according to another embodiment, a method for forming a packaged electronic device (for example, elements 100, 200, 300, 400) includes the steps of providing a leadframe (for example, elements 110, 210, 310, 410) including a die pad (for example, elements 111, 211, 311, 411), a plurality of tie bars (for example, elements 112, 412) outwardly extending from respective corners of the die pad, and a plurality of lands (for example, elements 114, 214, 314, 414) adhered to insulation members (for example, elements 120, 220, 320, 420) and spaced apart from respective sides of the die pad. The method includes attaching an electronic die (for example, element 130) to the die pad of the leadframe and electrically connecting the electronic die to the plurality of lands of the leadframe with conductive structures (for example, element 140). The method includes encapsulating the leadframe, the insulation members, the electronic die and the conductive structures using an encapsulant (for example, element 150).

Those skilled in the art will also appreciate that according to a still further embodiment, an electronic device package structure (for example, elements 100, 200, 300, 400) comprises a leadframe (for example, elements 110, 210, 310, 410) having a die pad (for example, elements 111, 211, 311, 411), a land connect bar (for example, element 113, 213, 313, 413) spaced apart from the die pad, and a plurality of lands (for example, elements 114, 214, 314, 414) between the land connect bar and the die pad and spaced apart therefrom. An insulating attachment member (for example, elements 120, 220, 320, 420) affixing the plurality of lands together and affixing the plurality of lands to one of the die pad or the land connect bar. An electronic device (for example, element 130) is coupled to the die pad and electrically coupled to at least a portion of the plurality of lands. An encapsulant (for example, element 150) covers the electronic device, the insulating attachment member, at least a portion of the plurality of lands, at least a portion of the die pad, and at least a portion of the land connect bar, and wherein the encapsulant fills spaces between the land connect bar and the plurality of lands.

In view of all the above, it is evident that a novel structure and method is disclosed. Included, among other features, is a leadframe having a die pad, land connect bars spaced apart from the die pad, and a plurality of lands between the die pad and the land connect bars and spaced apart therefrom. In one embodiment, insulation members are adhered to the land connect bars and the plurality of lands to fix or hold them together and to electrically isolate them from each other. The insulation members overlap a space between the land connect bars and the plurality of lands. An encapsulant covers at least portions of the die pad, the land connect bars, the insulation members and the plurality of lands and fills the space between the land connect bars and the plurality of lands. In another embodiment, insulation members are adhered to the die pad and the plurality of lands. In a further embodiment, the insulation members are adhered to half etched portions formed in the land connect bars, the plurality of lands and/or the die pad. The structure and method eliminate the need to perform a separate mechanical sawing processing after the encapsulant step to electrically disconnect or isolate the plurality of lands from the land connect bar and from each other thereby simplifying the fabrication process, reducing cycle time, and reducing costs.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, the subject matter has been described for semiconductor devices; however the method and structure is directly applicable to other electronic devices, such as optoelectronic devices, sensor devices, imaging devices, solar cells, medical devices, and other devices configured for and/or benefited by package structures.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

What is claimed is:

1. An electronic device package structure comprising:
   a leadframe having a die pad, a land connect bar spaced apart from the die pad, and a plurality of lands between the land connect bar and the die pad and spaced apart from both the land connect bar and the die pad;
   an insulating attachment member affixing the plurality of lands together and affixing the plurality of lands to one of the die pad or the land connect bar;
   an electronic device coupled to the die pad and electrically coupled to at least a portion of the plurality of lands; and
   an encapsulant covering the electronic device, the insulating attachment member, at least a portion of the plurality of lands, at least a portion of the die pad, and at least a portion of the land connect bar, and wherein the encapsulant fills spaces between the land connect bar and the plurality of lands.

2. An electronic device package structure comprising:
   a leadframe having a die pad, a land connect bar spaced apart from the die pad, and a plurality of lands between the land connect bar and the die pad and spaced apart from both the land connect bar and the die pad;
   an insulating attachment member affixing the plurality of lands together and affixing the plurality of lands to one or more of the die pad and the land connect bar;
   an electronic device coupled to the die pad and electrically coupled to at least a portion of the plurality of lands; and
   an encapsulant covering the electronic device, the insulating attachment member, at least a portion of the plurality of lands, at least a portion of the die pad, and at least a portion of the land connect bar, and wherein the encapsulant fills spaces between the land connect bar and the plurality of lands.

3. The electronic device package structure of claim 2, wherein:
   each land includes a recessed portion defining a stepped portion in a top surface of the land;
   the land connect bar is affixed to the plurality of lands through the insulating attachment member;
   the land connect bar includes a recessed portion on a side adjacent to the plurality of lands, the land connect bar including a top surface having a stepped portion; and
   the insulating attachment member is affixed to the stepped portion of the land connect bar and the stepped portions of the plurality of lands.

4. A semiconductor device structure comprising:
   a semiconductor die including a plurality of bond pads;
   a leadframe including a plurality of lands and a land connect bar, wherein each land is spaced apart from the land connect bar;
   an insulation member adhered to the plurality of lands connecting portions between adjacent lands and connecting each land to the land connect bar;
   conductive structures electrically connecting the plurality of lands to the plurality of bond pads; and
   an encapsulant encapsulating the leadframe, the semiconductor die, the insulation member and the conductive structures, wherein the plurality of lands are exposed through a surface of the encapsulant.

5. The structure of claim 1, wherein the leadframe further comprises:
   a plurality of external leads protruding outwardly from a side surface of the encapsulant; and
   a plurality of internal leads positioned at an internal side of the encapsulant and extending a predetermined length in a direction from the external leads towards the semiconductor die, and wherein portions of the internal leads are exposed through the surface of the encapsulant.

6. The structure of claim 1, wherein the conductive structures are connected to top surfaces of the plurality of lands.

7. The structure of claim 1, wherein the insulation members are adhered to top surfaces of the plurality of lands.

8. The structure of claim 1, wherein outer peripheries of the plurality of lands exposed through the surface of the encapsulant are surrounded by the encapsulant.

9. The structure of claim 1, wherein the plurality of lands include recessed portions defining stepped portions in top surfaces of the plurality of lands.

10. The structure of claim 9, further comprising a die pad spaced apart from the plurality of lands and a tie bar, wherein the insulation member connects the land connect bar to the tie bar, and wherein the semiconductor die is mounted to the die pad.

11. The structure of claim 10, wherein the plurality of lands are arranged to be spaced apart from the land connect bar towards the die pad.

12. The structure of claim 11, wherein the encapsulant is inserted into spaces between the plurality of lands and the land connect bar, and wherein the insulation member overlaps the encapsulant inserted in the spaces.

13. The structure of claim 10, wherein the land connect bar includes a recessed portion on a side adjacent to the plurality of lands so that a top surface of the land connect bar has a stepped portion.

14. The structure of claim 13, wherein the insulation member is adhered to the recessed portion of the land connect bar and adhered to the recessed portions of the plurality of lands.

15. The structure of claim 14, wherein the insulation member protrudes to an upper side of the leadframe.

16. The structure of claim 14, wherein the insulation member has an upper surface substantially coplanar with upper surfaces of the plurality of lands and substantially coplanar with an upper surface of the land connect bar.

17. The structure of claim 13, wherein the plurality of lands each include recessed portions on opposing sides and include bonding regions on top surfaces between the recessed portions.

18. The structure of claim 17, wherein the die pad includes recessed portions at an outer periphery of the top surface of the die pad, so that the die pad is stepped with respect to its central portion having the semiconductor die mounted thereon.

19. The structure of claim 18, further comprising a second insulation member, wherein the second insulation member is adhered to a top surface of a recessed portion of the die pad and adhered to top surfaces of the recessed portions of the plurality of die pads adjacent to the die pad, and wherein the insulation member is adhered to top surfaces of the recessed portions of the land connect bars and adhered to top surfaces of the recessed portions of the plurality of lands adjacent to the land connect bars.

20. The semiconductor device of claim 19, wherein an upper surface of the insulation member is substantially coplanar with upper surfaces of the plurality of lands and substantially coplanar with an upper surface of the land connect bar, and wherein an upper surface of the second insulation member is substantially coplanar with an upper surface of the die pad and the upper surfaces of the plurality of lands.

\* \* \* \* \*